(12) United States Patent
Feiweier

(10) Patent No.: US 8,638,098 B2
(45) Date of Patent: Jan. 28, 2014

(54) METHOD AND MAGNETIC RESONANCE SYSTEM TO GENERATE A SERIES OF MAGNETIC RESONANCE EXPOSURES

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 318 days.

(21) Appl. No.: 13/231,028

(22) Filed: Sep. 13, 2011

(65) Prior Publication Data

US 2012/0068702 A1     Mar. 22, 2012

(30) Foreign Application Priority Data

Sep. 21, 2010 (DE) .......................... 10 2010 041 125

(51) Int. Cl.
*G01V 3/00* (2006.01)
(52) U.S. Cl.
USPC .......................................... 324/309; 324/307
(58) Field of Classification Search
USPC ............................ 324/300–322; 600/407–445
See application file for complete search history.

(56) References Cited

U.S. PATENT DOCUMENTS

| | | | | |
|---|---|---|---|---|
| 6,005,916 | A * | 12/1999 | Johnson et al. | 378/87 |
| 2010/0171498 | A1 | 7/2010 | Auslender et al. | |
| 2011/0187367 | A1 | 8/2011 | Feiweier et al. | |
| 2011/0241679 | A1 | 10/2011 | Feiweier et al. | |
| 2012/0316439 | A1 * | 12/2012 | Behar | 600/439 |
| 2013/0096415 | A1 * | 4/2013 | Ruff et al. | 600/410 |

FOREIGN PATENT DOCUMENTS

| | | |
|---|---|---|
| DE | 10 2010 013 605 A1 | 6/2011 |
| DE | 10 2010 001 577 A1 | 9/2011 |

OTHER PUBLICATIONS

"Eddy Current Correction in Diffusion-Weighted Imaging Using Pairs of Images Acquired With Opposite Diffusion Gradient Polarity," Bodammer et al., Magnetic Resonance in Medicine, vol. 51 (2004), pp. 188-193.
"Correction for Distortion of Echo-Planar Images Used to Calculate the Apparent Diffusion Coefficient," Hasselgrove et al., Magnetic Resonance in Medicine, vol. 36 (1996), pgs. 960-964.
"Mutual Information," Lathan et al., Scholarpedia (2009).

\* cited by examiner

*Primary Examiner* — Brij Shrivastav
(74) *Attorney, Agent, or Firm* — Schiff Hardin LLP

(57) ABSTRACT

In a magnetic resonance method and apparatus, a series of magnetic resonance exposures of an examination subject is generated by implementing multiple first measurements (data acquisitions) with variation of a measurement parameter from acquisition-to-acquisition, which strongly influences a contrast of the first material type excited in the first measurements, implementing multiple second measurements in which a second material type is essentially selectively imaged that is less contrast-dependent with regard to this measurement parameter in a processor calculating spatial correction values for image data of the first measurements based on spatial differences between image data of different second measurements, and, also in the processor, spatially correcting image data of the first measurements (Di) and/or registration of image data of different first measurements to one another on the basis of the correction values.

15 Claims, 3 Drawing Sheets

METHOD AND MAGNETIC RESONANCE SYSTEM TO GENERATE A SERIES OF MAGNETIC RESONANCE EXPOSURES

BACKGROUND OF THE INVENTION

1. Field of the Invention

The invention concerns a method to generate a series of magnetic resonance exposures of an examination subject, in which method multiple first measurements are implemented with variation of a measurement parameter that strongly affects a contrast of a first material type excited in the first measurements. Moreover, the invention concerns a magnetic resonance system (also called an "MR system" in the following) with which such a method can be implemented.

2. Description of the Prior Art

In the generation of magnetic resonance exposures, the body to be examined is exposed to a relatively high basic magnetic field of 1.5 Tesla, 3 Tesla or (in newer high magnetic field systems) even of 7 Tesla, for example. A radio-frequency excitation signal is then emitted with a suitable antenna device, which excitation signal causes nuclear spins of specific atoms that are excited to resonance by this radio-frequency field in the basic magnetic field, to be flipped by a specific flip angle relative to the magnetic field lines of the basic magnetic field. The radio-frequency signal radiated upon relaxation of the nuclear spins, known as the magnetic resonance signal, is then detected with suitable antenna devices (which can also be identical to the transmission antenna device). The raw data acquired in such a manner are subsequently used in order to reconstruct the desired image data. For spatial coding, respective defined magnetic field gradients are superimposed on the basic magnetic field during the transmission and the readout or reception of the radio-frequency signals.

A magnetic resonance acquisition has typically included a number of individual partial measurements in which raw data from different slices of the examination subject are acquired in order to subsequently reconstruct volume image data therefrom. In many examinations, it is also necessary to implement multiple magnetic resonance acquisitions—i.e. an entire series of magnetic resonance acquisitions—of the examination subject, wherein a defined measurement parameter is varied from acquisition-to-acquisition. Using the measurements, the effect of this measurement parameter on the examination subject is observed in order to later draw diagnostic conclusions from this. As used herein, a "series" means at least two (but normally more than two) magnetic resonance acquisitions. A measurement parameter is varied so that the contrast of a specific material type excited in the measurements (for example a tissue type of the examination subject or a chemical substance) that is significant for the majority of or specific tissue types (water, for example) is affected as strongly as possible by the variation of the measurement parameter. This ensures that the effect of the measurement parameter on the examination subject is particularly well visible.

A typical example of such a series of magnetic resonance acquisitions is contrast agent examinations, in particular acquisitions known as perfusion measurements. A magnetic resonance-active contrast agent (based on relaxation-promoting gadolinium complexes, for example) is administered to the patient at a specific start point in time, and then the enrichment and washing out of the contrast agent in a defined volume of the examination subject is observed and documented with the use of a series of magnetic resonance acquisitions. The images before, during and/or after administration of the contrast agent can also be compensated with one another. Given perfusion measurements in the brain, up to 100 images or more of the identical volume are acquired continuously at intervals of a few seconds, for example, and the contrast agent distribution is measured. Depending on the temporal and spatial distribution of the contrast agent, regionally different intensity-time curves are observed in the image series, which curves can be converted into perfusion maps with corresponding models.

An additional typical example of a series of magnetic resonance acquisitions with variation of a measurement parameter strongly affecting the contrast is difference imaging methods. In diffusion imaging, multiple images are normally acquired and combined with one another with different diffusion directions and weightings. The strength of the diffusion weighting is mostly defined by what is known as the "b-value", The diffusion images with different diffusion directions and diffusion weightings or the images combined from these can then be used for diagnostic purposes. Parameter maps with particular diagnostic significance—for example maps that reflect the "Apparent Diffusion Coefficient (ADC)" or the "Fractional Anisotropy (FA)"—can thus be generated by suitable combinations of the acquired diffusion-weighted images.

Since multiple (at least two) successively acquired images are always set in relation to one another (for example a subtraction of the images in the simplest case) in all of these methods, relative deviations in the image geometry can lead to artifacts. Therefore, in MR imaging it is of particularly great importance to be able to register the images to one another correctly, particularly given the evaluation of such series of magnetic resonance exposures. As used herein a "registration" means a spatial association of the image pixels or voxels of two images.

In perfusion measurements or other contrast agent examinations, the spatial association in the successive exposures no longer coincides if the patient moves during the measurement. This can lead to errors in the evaluation. Given acquisition of data from the brain, the precision of the evaluation can in principle be markedly improved by registration of the individual volume data with the assumption of a rigid body movement.

In a diffusion imaging, distortions that depend on the direction and the strength of the diffusion weighting occur due to residual eddy current fields, even without movement of the patient (which can additionally play a role). The precision of the evaluation can in principle be markedly improved via registration of the individual images to one another under the assumption of an affine or complex spatial transformation.

While the registration of images with identical or similar contrast is quite robustly possible with established methods, it is the registration of images with significantly different contrasts that, as before, represents a challenge. Existing methods with which a registration to reduce geometric deviations is conducted given the presence of images of different contrasts typically use a measure of similarity that is optimally independent of the contrast. This measure of similarity is then used within the scope of an optimization method (for example a simplex optimization) in order to determine the parameters of an underlying spatial transformation. A prevalent example of a measure of similarity with such properties is entropy-based "Normalized Mutual Information" (NMI). An explanation of "Normalized Mutual Information" (NMI) is found in [sic] Peter E. Latham and Yasser Roudi (2009), Scholarpedia, 4(1):1658. NMI then precisely delivers a high measure of similarity between two images when an intensity $I_2$ at the same location in a second image is to be simultaneously associated with optimally many pixels or voxels of intensity $I_1$ in the first image. For example, rigid body motion (such as translation and rotation), affine transformations (i.e. transformations with a scaling, a shearing and a displacement or translation) but also transformations of more complex geometry are considered as transformations, for example. Methods for the registration of different images within the scope of diffusion measurements with the use of such optimization methods are described in DE 10 2010 001 577, DE 10 2010 013 605 and US 2010/0171498 A1, for example.

Although with measures of similarity such as NMI it is already possible to compare images of different contrasts with one another and to register them to one another, there are always still cases in which the precision or robustness of the registration is insufficient. In particular, strong variations of the contrast, possibly concomitant with a nearly complete suppression of certain tissue types in one of the images, leads to residual errors given existing methods. However, such strong contrast variations occur given (for example) the administration of contrast agents such as the cited perfusion measurements or in diffusion-weighted imaging.

SUMMARY OF THE INVENTION

An object of the present invention is to provide an improved method to acquire a series of magnetic resonance exposures in order to enable a better comparison of different exposures of the series among one another given a strongly varying contrast. It is also an object to provide magnetic resonance system that can be operated to implement such a method.

The term "strongly varying contrast" is used herein to mean that the influence of the measurement parameter on the image contrast is significant to the observer, relative to other tissue types on which such a measurement parameter has barely any influence. For example, specific contrast agents become particularly well noticeable with a marked contrast difference in strongly perfused tissue but not in adipose or osseous tissue.

Within the scope of the method according to the invention, multiple first measurements are implemented with variation of the desired measurement parameter (for example a contrast agent concentration given a perfusion measurement or a diffusion weighting given a diffusion imaging), wherein the contrast of the first material type excited in these first measurements is strongly influenced. According to the invention multiple second measurements are also implemented in which a second material type is selectively significantly imaged (for example is excited) that is less contrast-dependent with regard to this measurement parameter, preferably is nearly not contrast-dependent at all. "Significantly" means that the second material type is the origin or source of so much of the image data generated in the second measurements so as to be distinctly recognizable as such relative to other materials or tissue. Spatial correction values for the image data of the first measurements can then be calculated based on spatial differences (for example distortions or displacements) between the image data of multiple (at least two) of the second measurements. The image data of the first measurements can subsequently be spatially corrected on the basis of the correction values, or image data of different first measurements can be registered to one another or compared with one another.

The calculation of the correction parameters for correcting or deskewing and/or registering the image data of the usable measurements can take place in a known manner, for example with an iterative optimization method based on a similarity function or a measure of similarity.

Since the second measurements in the method according to the invention are always used as a type of adjustment measurements, they are subsequently also designated as "adjustment measurements", even though it is not precluded that these images are additionally used for diagnostic purposes. In contrast to this, the first measurements are designated as "usable measurements" or "diagnostic measurements" since these measurements should in any event be used later in order to clarify diagnostic questions.

In addition to an image acquisition unit to generate a series of magnetic resonance exposures of an examination subject and to implement multiple first measurements with variation of a measurement parameter which strongly affects a contrast of a first material type excited in the first measurements, and multiple second measurements in which a second material type is selectively, significantly excited that is less contrast-dependent with regard to this measurement parameter, a magnetic resonance system according to the invention requires a correction parameter determination unit. This correction parameter determination unit is fashioned so that, during operation, it calculates spatial correction values for image data of the first measurements on the basis of spatial differences between image data of multiple second measurements. Moreover, the magnetic resonance system according to the invention possesses an image processing unit (for example an image correction unit) for spatial correction of image data of the first measurements and/or for registration of image data of different first measurements to one another on the basis of the correction values.

The correction parameter determination unit and the image processing unit can be arranged in a central controller of the magnetic resonance system or in a separate, downstream image processing unit (for example a workstation serving as an image viewing and processing unit) to which, for example, the image data from the usable measurements and the adjustment measurement are transmitted after the reconstruction.

The method according to the invention and the magnetic resonance system according to the invention thus have the advantage that a precise and robust registration is possible on the basis of the image data from the adjustment measurements, in spite of significantly different contrasts of the diagnostic images. Artifacts in the final, combined images that are to be evaluated can thereby be better avoided, and thus the examination results can be made more certain.

A preferred way to selectively excite a second material type is to select the second material type so that it has a different magnetic resonance frequency than the first material type. Particularly when the first material type is water—meaning that a water excitation is used in a typical manner for the usable measurements—it is suggested to select adipose tissue as a second material type. Adipose tissue has the advantage that it shows no significant intensity variations given the administration of a number of contrast agents. The intensity of adipose tissue likewise shows no strong dependency on the diffusion weighting. Moreover, it is possible to specifically, selectively image adipose tissue with prevalent methods due to its resonance frequency being different than that of water (what is known as the "chemical shift"), for example in that a pure fat excitation or a water suppression takes place. Adjustment measurements can therefore be implemented whose image data depict nearly only adipose tissue, which do not strongly depend on the contrast-varying measurements parameters and which accordingly can be registered very precisely to one another or using which correspondingly precise correction parameters can then be determined.

In addition to fat, in principle other material or tissue types can also be used that can be specifically imaged. Falling into this category are, for example, spectroscopic metabolites such as choline, creatine etc., for example. Other MR-imaging nuclei are likewise be considered, for example $^{13}C$, $^{31}P$ etc. However, adipose tissue has the advantage that it occurs in larger quantities in the body, and the images generated with this can therefore be better registered to one another. In addition to this, for a fat imaging it is not necessary to use special RF antennas, as can possibly be necessary given specific other MR-imaging nuclei.

As mentioned, one possibility to calculate the correction values exists in initially implementing a registration of the image data of the adjustment measurements to one another. The correction values can then advantageously comprise transformation parameters of a transformation function or distortion-correction function. Not only the images of the second measurements but also the corresponding image data of the first measurements can then be registered to one another with this transformation function in that the same transformation function with the same or similar transformation parameters as in the registration of the image data of the adjustment measurements is applied to the image data of the usable measurements.

The calculation of the transformation parameters can take place in a known manner, for example with an advantageously iterative optimization method (particularly preferably by means of simplex maximization) using a similarity function. For example, the similarity of one adjustment image from the one adjustment measurement to a corresponding image from the second adjustment measurement is assessed on the basis of a measure of similarity, preferably on the basis of the NMI. In the iterative method the optimal correction parameters are then defined as variables, in particular coefficients of the transformation or, respectively, distortion-correction function.

As mentioned above, the image data of the second material type selectively excited during the adjustment measurements should advantageously be representative (in terms of their geometric properties) of the diagnostic images to be corrected. In order to achieve this, in a preferred variant it is ensured that a second measurement (i.e. an adjustment measurement) is always implemented in temporal proximity to a first measurement (i.e. a usable measurement).

Particularly when a number of usable measurements are implemented, the adjustment measurements are also implemented at least in part between the first measurements. For example, the adjustment measurements can be inserted into suitable time intervals between the usable measurements. Preferably the usable measurements and the adjustment measurements are always implemented in alternation.

In order to ensure that the time resolution of the diagnostic measurements is at most only slightly reduced, the adjustment measurements are advantageously acquired with a slight spatial resolution. The sampling gaps of the usable measurements can thus be reduced. Since movements become noticeable in number of image pixels or voxels, even a lower spatial resolution is normally sufficient for a precise registration of the image data of the adjustment measurements.

The method can then advantageously be improved by implementing an interpolation between the image data of the adjustment measurements, for calculation of correction values. This is possible when a measurement is conducted with lower resolution, meaning that a spatial interpolation is implemented. In particular, information from neighboring slices can be used in order to not have to measure all slices during a measurement. Furthermore, a temporal interpolation is also possible when the adjustment measurements are implemented with larger time intervals than the usable measurements in order to calculate the matching correction values for each usable measurement.

As mentioned, there are various measurement parameters that have greater effects on the contrast of the tissue to be examined in the image data of the usable measurements. However, the method according to the invention particularly preferably lends itself to contrast agent measurements, i.e. when the measurement parameter to be varied comprises a contrast agent concentration. Moreover, the method according to the invention can preferably be used in the cited diffusion imaging measurements in which the measurement parameter to be varied then comprises a diffusion weighting.

Given defined measurement parameters in which the variation of the measurement parameter also has an influence on the spatial distortion of the image data (as this is the case given diffusion gradients, for example), it should be insured that an adjustment measurement is respectively associated with different usable measurements which particularly preferably also closely follow one another in time, which adjustment measurement is implemented with a similar or the same value of the measurement parameter as the usable measurement associated with the corresponding adjustment measurement. This means that, given a diffusion imaging, at least one similar (but preferably exactly the same) diffusion weighting should be set in the adjustment measurement associated with a usable measurement as was set in the associated usable measurement. Given a measurement parameter that has no influence on a distortion of the image data—for example a contrast agent concentration—this criterion is not as important. Here it is primarily to be heeded that the adjustment measurements lie so close together in time that the spatial distortions or shifts caused by movements of the examination subject are easily detected.

However, the method according to the invention is applicable in diffusion imaging even when the adjustment measurements are implemented entirely before the usable measurements (as in US 2010/0171498 A1). In these adjustment measurements the system-specific distortions due to eddy currents are respectively determined—representatively for a defined amplitude of the diffusion gradients—for the three physical gradient axes. Using a linear model (independent overlaying of the distortions of the three axes and linear scaling of the distortions with the gradient amplitude) the necessary correction parameters can therefore be determined for arbitrary b-values and diffusion directions of the usable measurement. The adjustment measurements (which normally are not used for diagnostic purposes) can be acquired with the new approach, meaning that a tissue type with weak dependence of the contrast on the diffusion weighting (fat, for example) is selectively excited. Additional adjustment measurements between the usable measurements are therefore no longer necessary for the correction of the eddy current distortions. Additional adjustment measurements between the usable measurements could then advantageously be used in order to also additionally correct patient movements in addition to the correction of the distortions.

DESCRIPTION OF THE PREFERRED EMBODIMENTS

Figure 1:
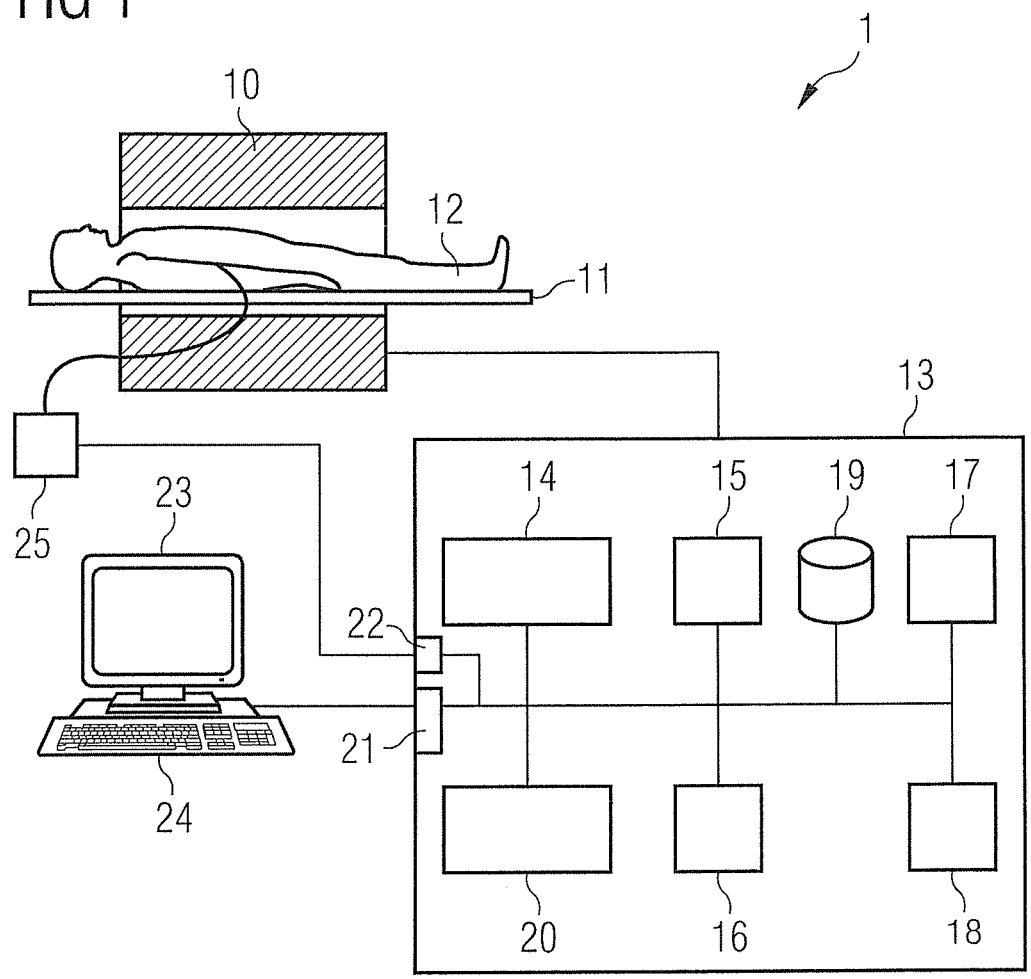
FIG. 1 schematically illustrates an MR system according to an exemplary embodiment of the invention.

A magnetic resonance system 1 according to the invention is schematically depicted in FIG. 1. It includes the actual magnetic resonance scanner 10 with an examination space or patient bore into which an examination subject 12 can be driven on a bed 11. The magnetic resonance scanner 10 is typically equipped with a basic magnetic field system, a gradient coil system and a transmission and reception radio-frequency (RF) antenna system that, for example, includes a whole-body coil permanently installed in the magnetic resonance scanner 10 and possibly additional local coils to be selectively arranged on the examination subject 12 (the individual magnet and coil systems are known to those skilled in the art and therefore are not shown in the schematic representation in FIG. 1).

The MR system 1 furthermore has a central control unit that is used to control the entire MR system 1. The central control unit 13 comprises an image acquisition unit 14 for pulse sequence control. In this the sequences of RF pulses and gradient pulses are controlled depending on a selected imaging sequence. The central control unit 13 has an RF unit 15 to output the individual RF pulses and a gradient unit 16 to control the gradient coils, which RF unit 15 and gradient unit 16 communicate accordingly with the image acquisition unit 14 for the emission of the pulse sequences. The RF unit 15 thereby comprises not only a transmission part in order to emit the RF pulse sequences but also a reception part in order to acquire coordinated raw magnetic resonance data. An image reconstruction unit (computer) 20 accepts the acquired raw data and reconstructs the MR images from the raw data.

The manner by which suitable raw data can be acquired by radiation of RF pulses and the generation of gradient fields and how MR images can be reconstructed therefrom and known in principle to those skilled in the art and need not be explained in detail herein.

An operation of the central control unit 13 can take place via a terminal interface 21 by means of an input unit 24 and a display unit 23, with which the entire MR system 1 can also be operated by an operator. MR images can also be displayed on the display unit 23 and measurements can be planned and started by means of the input unit 24, possibly in combination with the display unit 23.

Via an additional peripheral apparatus interface 22, additional apparatuses can be controlled by the central control unit 13 and/or data can be read out from these apparatuses. In the design shown in FIG. 1, a contrast agent injector 25 is connected with which a contrast agent is administered to the patient 12. The point in time, the duration and the dose of the contrast agent administration can thus be suitably synchronized with the MR acquisitions (for example by the image acquisition unit 14), or may be planned in advance by means of the input unit 24 in combination with the display unit 23. Alternatively, the injection of the contrast agent can also be triggered manually by an operator during the running measurements.

Figure 3:
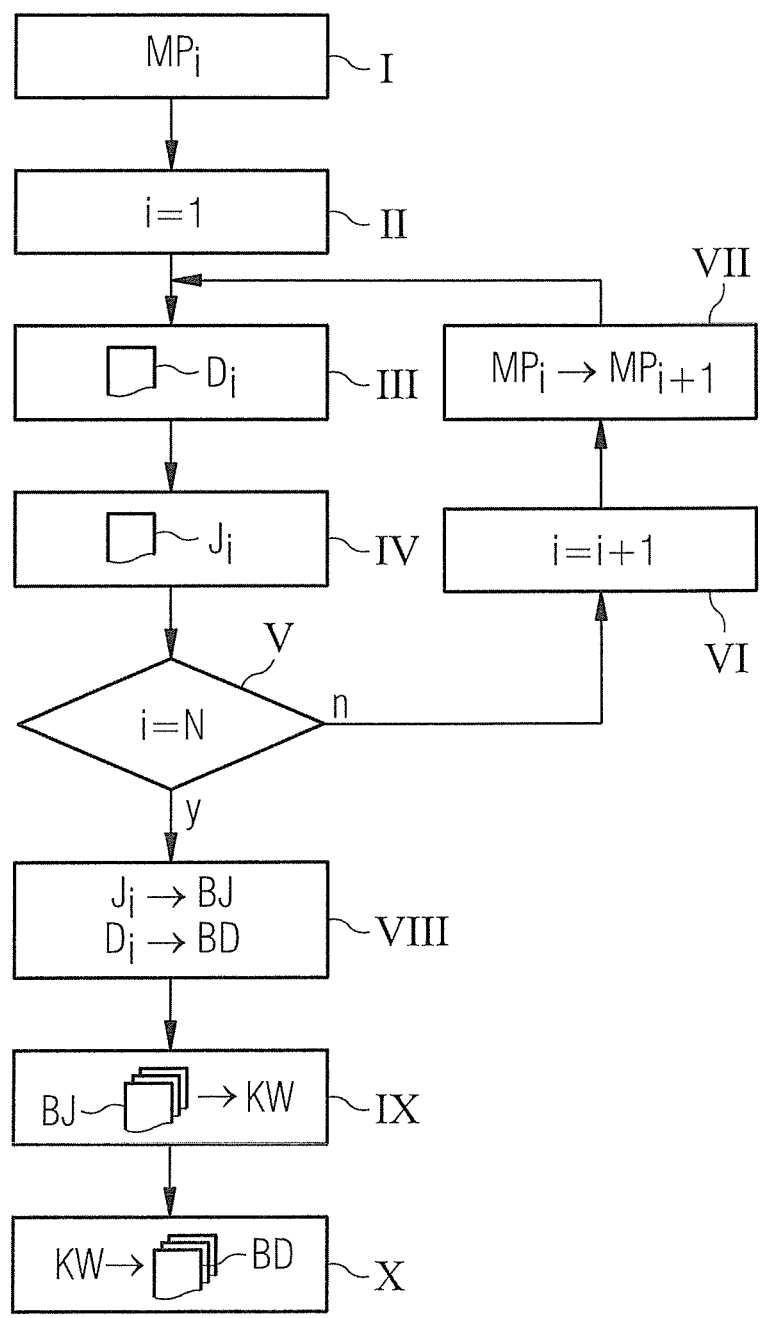
FIG. 3 is a flow chart of an embodiment of the method for correction of image data of a series of magnetic resonance exposures according to the invention.

The problem forming the basis of the invention is explained again using FIG. 3, in which are shown measurements from a diffusion imaging of a brain. As explained above, to create diffusion-weighted images, diffusion gradients of different strengths are switched (activated) during a measurement in addition to the gradients for the spatial coding. The strength of the diffusion weighting is specified with a value known as the b-value with the signal intensity S according to $S = S_0 \cdot e^{(-b \cdot ADC)}$. ADC is, as noted above, the "apparent diffusion coefficient". The principle of the acquisition of diffusion-weighted magnetic resonance images is known to those skilled in the art and therefore need not be explained in further detail herein.

Figure 2:
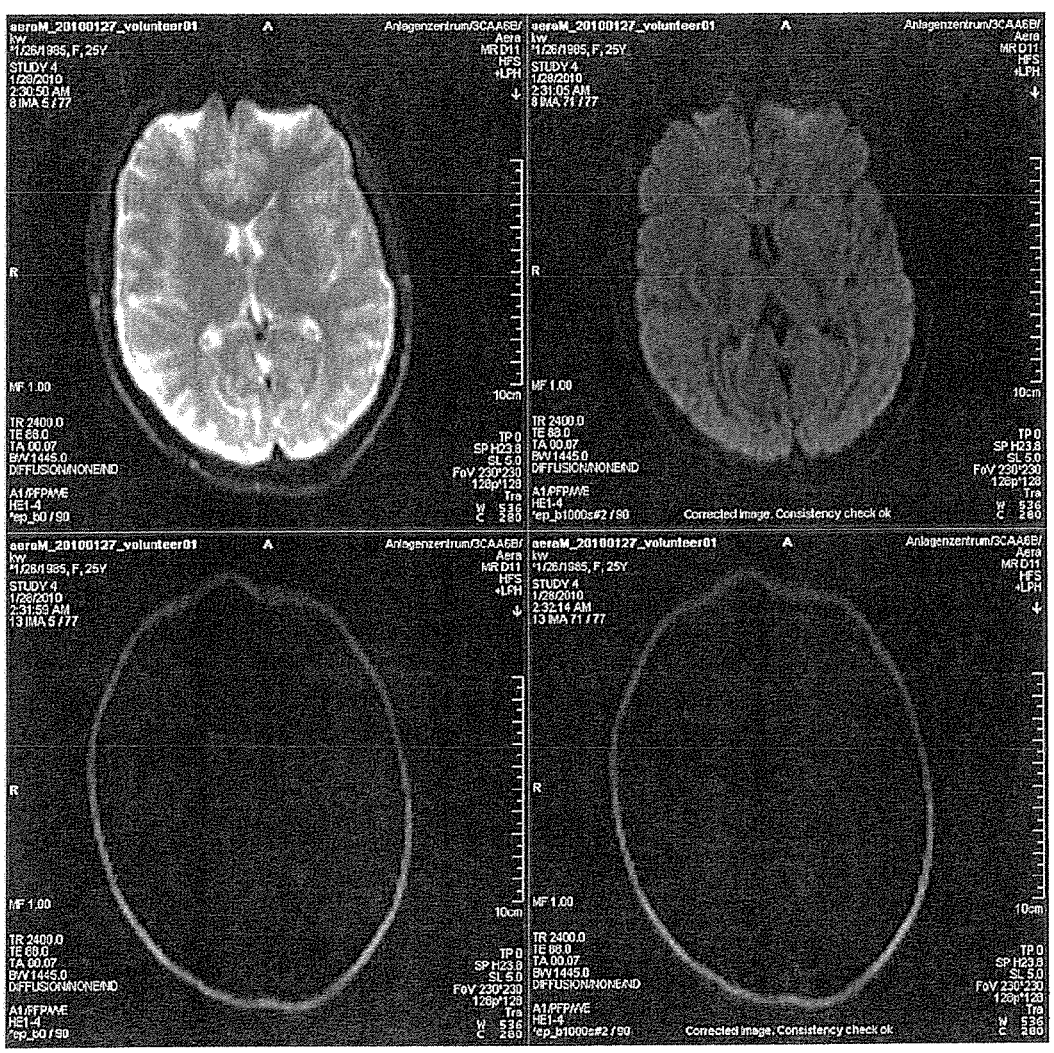
FIG. 2 shows four comparison images of different usable measurements and adjustment measurements implemented with different diffusion gradients.

However, the diffusion gradients not only alter the contrast, as desired, but also—undesirably—cause a significant distortion in the acquired magnetic resonance images. This is apparent from the two upper images in FIG. 2. There an axial slice image of the water signal without diffusion weighting is shown to the left. Shown next to this to the right is the same slice with a diffusion weighting of $b = 1000$ s/mm$^2$. Here the significantly different tissue intensities and tissue contrasts are clearly visible, as well as an additional geometry distortion, which represents a challenge for conventional registration methods.

In contrast to this, shown to the left of this in the lower row is a slice of the same brain region, again without a diffusion weighting. However, here it is essentially the fat signal that is selectively acquired. This means that a magnetic resonance frequency of 3.3 ppm below the water magnetic resonance frequency was selected in order to optimally excite only the adipose tissue. Next to this to the right is the same slice again, with a diffusion weighting of $b = 1000$ s/mm$^2$. The image contrast between these two lower images is absolutely identical since in the image only the subcutaneous fat is visible, which makes a registration (and thus a determination of a distortion-correction function) very simple. This advantage is utilized in the method according to the invention.

FIG. 3 schematically shows a possible method workflow for implementation of a measurement according to the invention of a series of magnetic resonance exposures.

The method starts in Step I, for example in that a measurement protocol is initially retrieved and all required parameters are accordingly set as is required for the following measurement. In particular, the measurement parameter $MP_i$ to be varied can be set to a start value within the scope of this measurement preparation.

A control variable i is then initially set to the start value of 1 in Step II.

The first usable measurement $D_i$ or, respectively, diagnostic measurement then takes place in Step III, for example the first reference measurement without application of a diffusion gradient given a diffusion imaging.

An associated adjustment measurement $J_i$ which is created with the same diffusion gradient subsequently takes place in Step IV. However, it must be ensured that a material type or, respectively, tissue type is to be excited which shows only slight contrast changes upon application of a diffusion gradient. For example, as in the measurements in FIG. 2 the usable measurement $D_i$ is implemented with a magnetic resonance frequency which excites the water signal and the adjustment measurement $J_i$ is implemented with a magnetic resonance frequency that excites the fat signal.

In Step V it is queried whether the maximum number of measurements for the measurement series has been reached. In the present case the maximum number is N, which can have a value of 2 or even a higher value depending on how many diffusion gradient measurements should be produced. If the maximum number N of measurements has not yet been implemented (branch "n"), in Step VI the control variable i is increased by 1, and in Step VII the measurement parameter $MP_i$ (the diffusion weighting in the present case) is likewise set to a new value (symbolized by the transition from $MP_i$ to $MP_{i+1}$), namely the value which is provided for the second usable measurement $D_{i+1}$.

The method is subsequently continued again in Step III in that the usable measurement $D_{i+1}$ is implemented with the new measurement parameter value in order to then implement the associated adjustment measurement $J_{i+1}$ again in Step IV with the same measurement parameter value.

This loop is continued until it is established in Step V that all measurements have been implemented and the control variable corresponds to the maximum number N of planned measurements (branch "y"). In Step VIII the image data BD, BJ for these measurements are subsequently reconstructed from the measurement data or raw data of the usable measurements $D_i$ and adjustment measurements $J_i$ (i=1, . . . , N).

Such a reconstruction can naturally also already be conducted in parallel with the measurements of the series as soon as a measurement was completed in order to keep the total measurement and calculation time as short as possible. The order—whether a usable measurement $D_i$ actually takes place and then an adjustment measurement $J_i$ (as shown in FIG. 3) or vice versa—is likewise insignificant.

Correction values KW are then determined in Step IX on the basis of the image data BJ of the adjustment measurements. Given a diffusion imaging, for example, the images generated with the fat imaging in the adjustment measurements can be registered to one another. As was clarified using FIG. 3, this is possible relatively simply since there are no or only very slight contrast changes between the images. For this typical registration methods can be used in order to find a transformation or, respectively, distortion-correction function as they are implemented in, for example, DE 10 2010 001 577, DE 10 2010 013 605 and US 2010/0171498 A1, in particular in connection with the publications by Bodammer et al. (in MRM 51: 188-193, 2004) and Haselgrove et al. (in MRM 36: 960-964, 1996) that are cited in these documents, the contents of which are inasmuch incorporated here.

The transformation functions or, respectively, distortion-correction functions with associated transformation parameters (for example the coefficients of the transformation functions) are thereby determined as correction values. For example, this can take place in a correction parameter determination unit 17 of the central control unit 13 in the exemplary embodiment of a magnetic resonance apparatus according to the invention that is presented in FIG. 1.

These correction values can be passed to an image processing unit 18 which, in Step X, then uses the correction values in order to correct the image data BD of the usable measurements $D_i$ on this basis or to directly register different images of the usable measurements $D_i$ to one another and possibly to evaluate these further, for example to generate difference images.

In the adjustment measurements the movement of the examination subject can likewise be detected, wherein the correction parameters are, for example, used only for the distortion-correction of the diffusion-weighted MR images when the movement is less than a predetermined limit value. US 2010/0171498 is referenced again for the details of the aforementioned method.

In a similar manner shown in FIG. 3, the method can also be used for the registration of images of an acquisition series during a contrast agent measurement (perfusion measurement, for example). Given the contrast agent administration the tissue intensity in the image is mostly reduced with strong regional differences, which means that the image contrast changes quickly to a significant degree as time proceeds, which makes the registration difficult when the patient moves between the measurements. In this case as well the method according to FIG. 3 can be applied, wherein an adjustment measurement is implemented again each time before or after a usable measurement, for example. However, here Step VII can normally be omitted since for the most part contrast agent is only provided once at the start and the measurement parameter $MP_i$ (namely here the contrast agent concentration) changes continuously anyway with time. Inasmuch, given such a contrast agent measurement it is all the more important that the usable measurement and the associated adjustment measurement are situated as close as possible to one another, or that a temporal interpolation is implemented between the image data BJ of the adjustment measurements $J_i$. In addition, if the spatial shifts are mere head movements it is not necessary in Step IX that a complicated distortion-correction function is calculated; rather, it is then sufficient to determine correction values on the basis of the image data BJ of the adjustment measurements $J_i$, for example, which correction values can be used for a rigid body transformation that represents the movement of the head.

As mentioned, interpolation methods can be used in order to reduce the measurement cost. In particular, information from neighboring slices can hereby be used in order to not have to measure all slices during a measurement. For example, this is explained in detail in DE 10 2010 013 605, the contents of which are incorporated herein by reference. Insofar as adjustment measurements decided in advance are used to determine the registration parameters (as this is explained in US 2010/0171498 A1) which are not used for the diagnosis, these can also be directly acquired as mere fat images so that no additional measurement cost arises.

The method thus overall offers the possibility of a significantly more precise and robust registration, even given different contrasts of the diagnostic images, wherein the measurement cost for the additional adjustment measurements (when these are implemented in a suitable manner) is only minimal; or, if adjustment measurements must be implemented in any case for different reasons, no additional measurement cost arises at all.

It should be noted that the described structures and steps are merely exemplary embodiments, and that the basic principle can also be varied in wide ranges by those skilled in the art without departing from the scope of the invention. In particular, the aforementioned methods can be combined, for example, wherein multiple measurement parameters are also possibly varied during an acquisition series. However, it should then be ensured that the adjustment measurements are temporally placed or implemented with corresponding measurement parameters or, respectively, measurement parameter sets so that they are respectively always representative of the diagnostic images with respect to their geometric properties.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate a series of magnetic resonance exposures of an examination subject, comprising:

operating a magnetic resonance data acquisition unit to implement a plurality of first magnetic resonance data acquisitions from a subject while varying a measurement parameter, which strongly influences a contrast of a first material type excited in the subject in the first data acquisitions, from first data acquisition-to-first data acquisition;

operating said magnetic resonance data acquisition unit to implement a plurality of second data acquisitions in which a second material type in the subject is selectively imaged that is less contrast-dependent than said first material type with regard to said acquisition parameter;

in a processor, calculating spatial correction values for image data of the first data acquisitions, based on spatial differences between image data of different data acquisitions among said second data acquisitions; and in said processor, using said spatial correction values to implement at least one of spatially correcting image data of said first data acquisitions to obtain spatially corrected image data and making the spatially corrected image data available at an output of the processor in electronic form, and bringing image data of different data acquisitions among said plurality of first data acquisitions into registration with each other to obtain registered images and making said registered images available in electronic form at an output of the processor.

2. A method as claimed in claim 1 comprising implementing said plurality of second data acquisitions to excite said second material type with a different magnetic resonance frequency than said first material type.

3. A method as claimed in claim 1 comprising implementing said plurality of second data acquisitions to excite adipose tissue, as said second material type.

4. A method as claimed in claim 1 comprising, in said processor, bringing image data sets respectively acquired in said second data acquisitions into registration with each other when calculating said correction values.

5. A method as claimed in claim 1 comprising calculating said correction values as transformation parameters of a transformation function.

6. A method as claimed in claim 5 comprising calculating said transformation values using an optimization method based on a measure of similarity between image data sets respectively acquired in said plurality of second data acquisitions.

7. A method as claimed in claim 1 comprising implementing said plurality of second data acquisitions in close temporal proximity to implementation of said plurality of first data acquisitions.

8. A method as claimed in claim 1 comprising at least partially interleaving implementation of said second data acquisitions with implementation of said plurality of first data acquisitions.

9. A method as claimed in claim 1 comprising implementing said plurality of second data acquisitions with a lower resolution than said first data acquisitions.

10. A method as claimed in claim 1 comprising, in said processor, interpolating image data sets respectively acquired with said plurality of second data acquisitions for calculating said correction values.

11. A method as claimed in claim 1 comprising, in said processor, determining a movement pattern of said examination subject using image data acquired from said plurality of second data acquisitions.

12. A method as claimed in claim 1 comprising injecting a contrast agent into the subject during said plurality of first data acquisitions and said plurality of second data acquisitions, and varying a contrast agent concentration as said measurement parameter.

13. A method as claimed in claim 1 comprising implementing said plurality of first data acquisitions and said plurality of second data acquisitions using diffusion-weighted imaging, and varying diffusion weighting as said measurement parameter.

14. A method as claimed in claim 1 comprising correlating respective data acquisitions in said plurality of second data acquisitions with corresponding data acquisitions in said plurality of first data acquisitions and, in the respectively correlated data acquisitions, giving said measurement parameter substantially equal values.

15. A magnetic resonance system comprising:

a magnetic resonance data acquisition unit operated by a computerized control unit;

said computerized control unit being configured to operate said magnetic resonance data acquisition unit to implement a plurality of first magnetic resonance data acquisitions from a subject while varying a measurement parameter, which strongly influences a contrast of a first material type excited in the subject in the first data acquisitions, from first data acquisition-to-first data acquisition;

said computerized control unit being configured to operate said magnetic resonance data acquisition unit to implement a plurality of second data acquisitions in which a second material type in the subject is selectively imaged that is less contrast-dependent than said first material type with regard to said acquisition parameter;

a processor configured to calculate spatial correction values for image data of the first data acquisitions, based on spatial differences between image data of different data acquisitions among said second data acquisitions; and said processor being configured to use said spatial correction values to implement at least one of spatially correcting image data of said first data acquisitions to obtain spatially corrected image data and to make the spatially corrected image data available at an output of the processor in electronic form, and to bring image data of different data acquisitions among said plurality of first data acquisitions into registration with each other to obtain registered images and to make said registered images available in electronic form at an output of the processor.

* * * * *